United States Patent [19]

Shimoyama

[11] Patent Number: 5,793,211

[45] Date of Patent: Aug. 11, 1998

[54] BATTERY REMAINING CAPACITY MEASURING SYSTEM FOR ELECTRIC MOTOR VEHICLES

[75] Inventor: Kenichi Shimoyama, Susono, Japan

[73] Assignee: Yazaki Corporation, Tokyo, Japan

[21] Appl. No.: 882,998

[22] Filed: Jun. 26, 1997

[30] Foreign Application Priority Data

Jun. 27, 1996 [JP] Japan ..................... 8-167470

[51] Int. Cl.$^6$ ..................... G01N 27/416; G01R 19/00
[52] U.S. Cl. ..................... 324/427; 324/431; 340/636; 320/48; 364/481
[58] Field of Search ..................... 324/426, 427, 324/428, 429, 433, 771; 364/481, 483, 550, 551.01; 320/44, 48; 340/636

[56] References Cited

U.S. PATENT DOCUMENTS

| | | | |
|---|---|---|---|
| 4,849,700 | 7/1989 | Morioka et al. | 324/427 |
| 5,287,286 | 2/1994 | Ninomiya | 364/481 |
| 5,321,627 | 6/1994 | Reher | 364/483 |
| 5,404,106 | 4/1995 | Matsuda | 324/427 |
| 5,479,085 | 12/1995 | Honda et al. | 324/48 |
| 5,592,094 | 1/1997 | Ichikawa | 324/427 |
| 5,617,324 | 4/1997 | Arai | 364/483 |
| 5,672,973 | 9/1997 | Aria et al. | 324/427 |

*Primary Examiner*—Diep N. Do
*Attorney, Agent, or Firm*—Oblon, Spivak, McClelland, Maier & Neustadt, P.C.

[57] ABSTRACT

A battery remaining capacity measuring system for an electric motor vehicle in which current data and voltage data are sampled at an interval of 1 ms so that a plurality of current data and a plurality of voltage data are averaged at an interval of 100 ms, respectively, to obtain sets of average current data and average voltage data which in turn, are collected and plotted on a current-voltage-axis coordinate. In addition, the current-voltage-axis coordinate is divided into a plurality of zones, and when an in-zone quantity decision section decides that the number of sets of average current data and average voltage data exceeds a given value in all the zones, a correlation coefficient decision section decides a coefficient of correlation between current and voltage. When the coefficient of correlation shows a high correlation, an approximate straight line calculating section calculates an approximate straight line, while a remaining capacity calculating section calculates and displays a remaining capacity.

4 Claims, 5 Drawing Sheets

BATTERY REMAINING CAPACITY MEASURING SYSTEM FOR ELECTRIC MOTOR VEHICLES

BACKGROUND OF THE INVENTION

1. Industrial Field of the Invention

The present invention relates to a battery remaining capacity measuring system for an electric motor vehicle, which performs the measurement of the remaining capacity of a battery when the number of sets of measurement data of currents flowing through a load and terminal voltages of the load at that time exceeds a given value while the vehicle is in a traveling condition.

2. Description of the Related Art

In general, a battery shows a variety of discharge characteristics in accordance with a characteristic of a load coupled thereto and an ambient temperature. In addition, in the battery, its discharge current I and its terminal voltage V intensively vary with the variation of the load.

For this reason, difficulty is encountered to specify the remaining capacity of the battery during the variation of the load. The following method has been known as the recent way to measure the remaining capacity of a battery of an electric motor vehicle. That is, while the motor vehicle is in the traveling condition, the discharge current I and the terminal voltage V are sampled at an interval of 1 milli second(ms) so that the average current and the average voltage are calculated and attained as the data on an I-V-axis coordinate when 100 ms passes, or when these data reach 100 sets.

At the elapse of 10 seconds after this procedure begins, that is, when the sets of the average currents and the average voltages come to 100 in number, the coefficient of correlation associated with the current and the voltage is obtained on the basis of the 100 sets of average currents and average voltages. Further, if that correlation coefficient indicates a larger negative correlation (which will be referred hereinafter to as a high correlation), an approximate straight line (I=a·V+b) indicative of the relationship between the current and the voltage is attained on the basis of the 100 sets of average currents and average voltages collected as the data on the I-V-axis coordinate. The present remaining capacity is specified by the resultant approximate straight line and displayed. This operation is conducted at an interval of 10 seconds.

In brief, the remaining capacity is obtainable under the condition that the current and voltage of the battery collected during the traveling of the electric motor vehicle show proper dispersion or variation on the I-V-axis coordinate.

However, the electric motor vehicle not only runs at a constant speed but also travels while gaining and reducing its speed. In addition, the motor vehicle may run on steep ascending and descending roads and travel in its full-accelerating condition.

For example, in the case of being in the full-accelerating condition, the discharge current and terminal voltage of a battery scarcely vary, and tend to gather around one point as shown in FIG. 5.

Consequently, if, for example, the average current and the average voltage arising at every 100 seconds are collected over a given period of time while the electric motor vehicle is in the running condition, as shown in FIG. 6 the data plotted on an I-V-axis coordinate can concentrate on one point.

Furthermore, in cases where the motor vehicle travels on an abrupt uphill in the full-accelerating condition, as shown in FIG. 7 the data plotted on the I-V-axis coordinate can gather around one point.

There is a problem which arises with the prior technique, however, in that decision can be made to that a high correlation occurs, irrespective of the coefficient of correlation being calculated on the basis of the data including the data centering around the one point.

In other words, if on the basis of only the coefficient of correlation the decision is made on the accuracy of dispersion of the data collected on the I-V-axis coordinate, there is a possibility that the remaining capacity is calculated relying upon an approximate straight line with a low reliability.

SUMMARY OF THE INVENTION

Accordingly, the present invention has been developed with a view to eliminating the above-mentioned problems, and it is an object of the present invention to provide a remaining capacity measuring system for an electric motor vehicle which is capable of calculating a remaining capacity with a high reliability on the basis of an approximate straight line attained when a plurality of data collected on an I-V-axis coordinate for a give period of time show proper dispersion.

For this purpose, according to an aspect of the present invention, there is provided a battery remaining capacity measuring system for an electric motor vehicle in which, when a plurality of sets of current data flowing in a load coupled to a battery and terminal voltage data of the same battery are collected while the electric motor vehicle is in its running condition, a coefficient of correlation between the current and the voltage is calculated on the basis of the plurality of sets of current data and voltage data collected, and in the case that this correlation coefficient indicates high correlation, the remaining capacity is instantaneously obtained on the basis of the plurality of sets of collected current data and voltage data and displayed, the battery remaining capacity measuring system comprising a remaining capacity operation means whereby the plurality of sets of collected current data and voltage data are plotted on a current-voltage-axis coordinate and the current-voltage-axis coordinate is divided into a plurality of zones by sectioning along current axis directions or along voltage axis directions, and the coefficient of correlation is calculated when the number of the sets of current data and voltage data exceeds a given number in all the zones.

In accordance with the present invention, while the motor vehicle is in its running condition, a plurality of sets of current data flowing in a load connected to a battery and terminal voltage data of the same battery are collected on a current-voltage-axis coordinate divided into a plurality of zones. The aforesaid correlation coefficient is calculated when the number of the sets of current data and voltage data exceeds (is equal to or more than) a given value within all the zones, and further the remaining capacity is instantaneously obtained when this correlation coefficient shows a high correlation.

In a preferred embodiment of this invention, when in any one of the plurality of zones the number of sets of current data and voltage data does not reach the given value, the aforesaid remaining capacity calculating section deletes all the current data and voltage data on the current-voltage-axis coordinate and again collects data to plots the collected data.

In another preferred embodiment of this invention, the remaining capacity operation means comprises: data collecting and averaging means for sampling the current data and the voltage data at a first given time interval and for averaging a plurality of current data and a plurality of voltage data at a second given time interval, respectively, to obtain sets of average current data and average voltage data to be collected and plotted on a current-voltage-axis coordinate; sectioning means for sectioning the current-voltage-axis coordinate along current axis directions or along voltage axis directions to divide it into a plurality of zones; in-zone quantity decision means for deciding whether or not the number of sets of average current data and average voltage data reaches a given value in all the zones; correlation coefficient decision means for deciding a coefficient of correlation on the basis of all the sets of average current data and average voltage data on the current-voltage-axis coordinate when the in-zone quantity decision means decides that the number of the sets of average current data and average voltage data reaches the given value in all the zones; approximate straight line calculating means for obtaining an approximate straight line on the basis of all the sets of average current data and average voltage data on the current-voltage-axis coordinate when the coefficient of correlation shows a high correlation; and remaining capacity calculating means for calculating a voltage value by substituting a given current value into the approximate straight line to obtain and display a remaining capacity corresponding to the resultant voltage value.

According to this embodiment, the current data and the voltage data are sampled at the first given time interval, whereas a plurality of sampled current data and a plurality of sampled voltage data are respectively averaged at the second time interval to establish the sets of average current data and average voltage data and to collect and plot them on the current-voltage-axis coordinate. In addition, the current-voltage-axis coordinate is divided into a plurality of zones, and the coefficient of correlation between the current and the voltage is determined by the correlation coefficient decision means when the in-zone quantity decision means decides that the number of the sets of average current data and average voltage data reaches the given value in all the zones. If the coefficient of correlation indicates a high correlation, an approximate straight line is calculated through the use of the approximate straight line calculating means and the remaining capacity is displayed through the remaining capacity calculating means.

Still further, in a preferred embodiment of this invention, storage means is provided which is made to memorize information available for sectioning the current-voltage-axis coordinate and the aforesaid given value.

According to this embodiment, the sectioning means sections the current-voltage-axis coordinates in accordance with the information stored in the storage means for sectioning. Further, in-zone quantity decision means compares the given value stored in the storage means with the number of the average current data and average voltage data in each zone.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
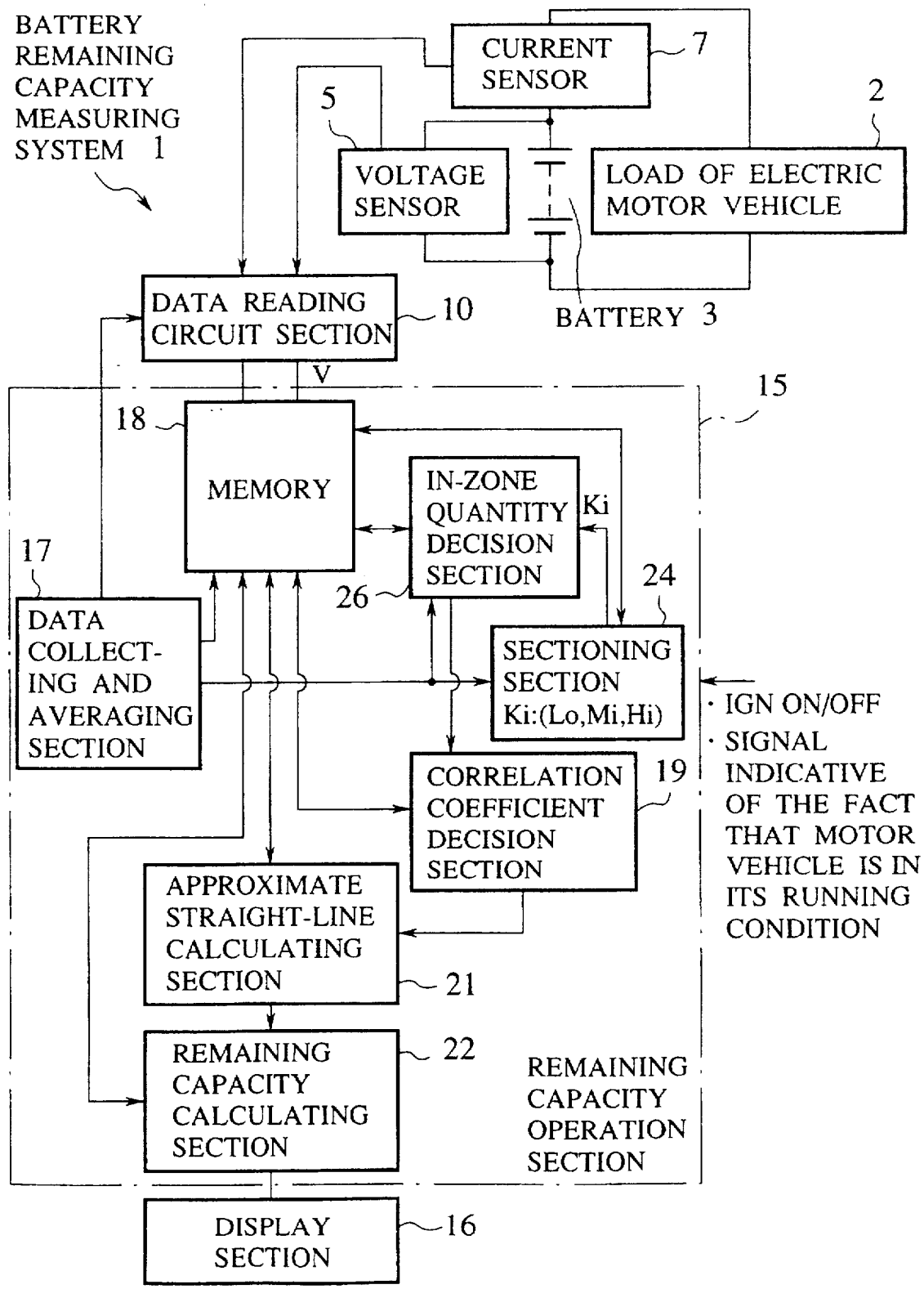
FIG. 1 is a schematic illustration of an arrangement of a battery remaining capacity measuring system for an electric motor vehicle according to an embodiment of the present invention.

FIG. 1 is a schematic illustration of an arrangement of a battery remaining capacity measuring system for an electric motor vehicle according to an embodiment of the present invention.

In FIG. 1, a battery remaining capacity measuring system, generally designated at numeral 1, collects a plurality of data being sets of average voltages and average currents, taken while the electric motor vehicle is in running conditions, on an I-V-axis coordinate where its horizontal axis (I axis) is divided to set up a plurality of sections therein, and calculates a coefficient of correlation on the condition that the number of data exceeds a given value in all the sections. Further, when this coefficient of correlation shows a high correlation, the system obtains an approximate straight line on the basis of the plurality of data on the I-V-axis coordinate to calculate the present remaining capacity.

This battery remaining capacity measuring system 1 is composed of a voltage sensor 5 connected in parallel to a battery 3 for supplying an electric power to a load 2 including a main motor and others of the electric motor vehicle, a current sensor 7 for sensing a current passing through the load 2, a data reading circuit section 10 for receiving signals from the voltage sensor 5 and the current sensor 7 to carry out a predetermined conversion, a remaining capacity operation section 15 for collecting data on an I-V-axis coordinate to calculate a remaining capacity on the basis of an approximate straight line obtained when the data whose number exceeds a given value scatteringly exist in all the sections, and a display section 16 for displaying the remaining capacity calculated in the remaining capacity operation section 15.

<Detailed Description of Parts>

The remaining capacity operation section 15 includes a data collecting and averaging section 17, a memory 18, a correlation coefficient decision means 19, an approximate straight line calculating section 21, a remaining capacity calculating section 22, a sectioning section 24, and an in-zone quantity decision section 26, and is placed into operation when the electric motor vehicle starts to travel after the turning-on of its ignition switch.

The data collecting and averaging section 17 outputs a sampling signal to the data reading circuit section 10 at an interval of 1 ms to accept current data and voltage data from the data reading circuit section 10 and to store the input data in the memory 18, and averages a plurality of current data and a plurality of voltage data, stored in the memory 18, to collect the average data on the I-V-axis coordinate whenever the elapse of 100 ms occurs. This averaging processing is conducted for 10 seconds.

The correlation coefficient decision section 19, when the in-zone quantity decision section 26 looks up the data collected on the I-V-axis coordinate in the memory 18 and decides that the number of the data exceeds a given value in all the zones, establishes a coefficient of correlation between current and voltage on the basis of these data and further checks whether or not the coefficient of correlation indicates a high correlation.

The approximate straight line calculating section 21, when the correlation coefficient decision section 19 decides that the coefficient of correlation shows the high correlation, calculates an approximate straight line (V=a·I+b) representative of a tendency of the respective data on the I-V-axis coordinate in the memory 18 through the use of the method of least squares.

The remaining capacity calculating section 22, whenever the approximate straight line calculating section 21 calculates the approximate straight line (V=a·I+b), specifies as the present voltage of the battery 3 a point of intersection between a reference current value memorized in the memory 18 and the calculated approximate straight line, and attains a remaining capacity equivalent to the specified voltage. In addition, the remaining capacity calculating section 22 makes the display section 16 display the attained remaining capacity and further makes the memory 18 store it.

The sectioning section 24 divides the I axis being the horizontal axis of the I-V-axis coordinate on the basis of the zones Lo, Mi and Hi (generally referred to as zone ki) preset in the memory 18.

The in-zone quantity decision section 26 checks whether or not the number of the data in each of the zones Lo, Mi and Hi exceeds a given number at every 10 seconds, that is, whenever 100 sets of average currents and average voltages obtained for 100 ms are collected on the I-V-axis coordinate in the memory 18.

<Description of the Whole Operation>

Figure 2:
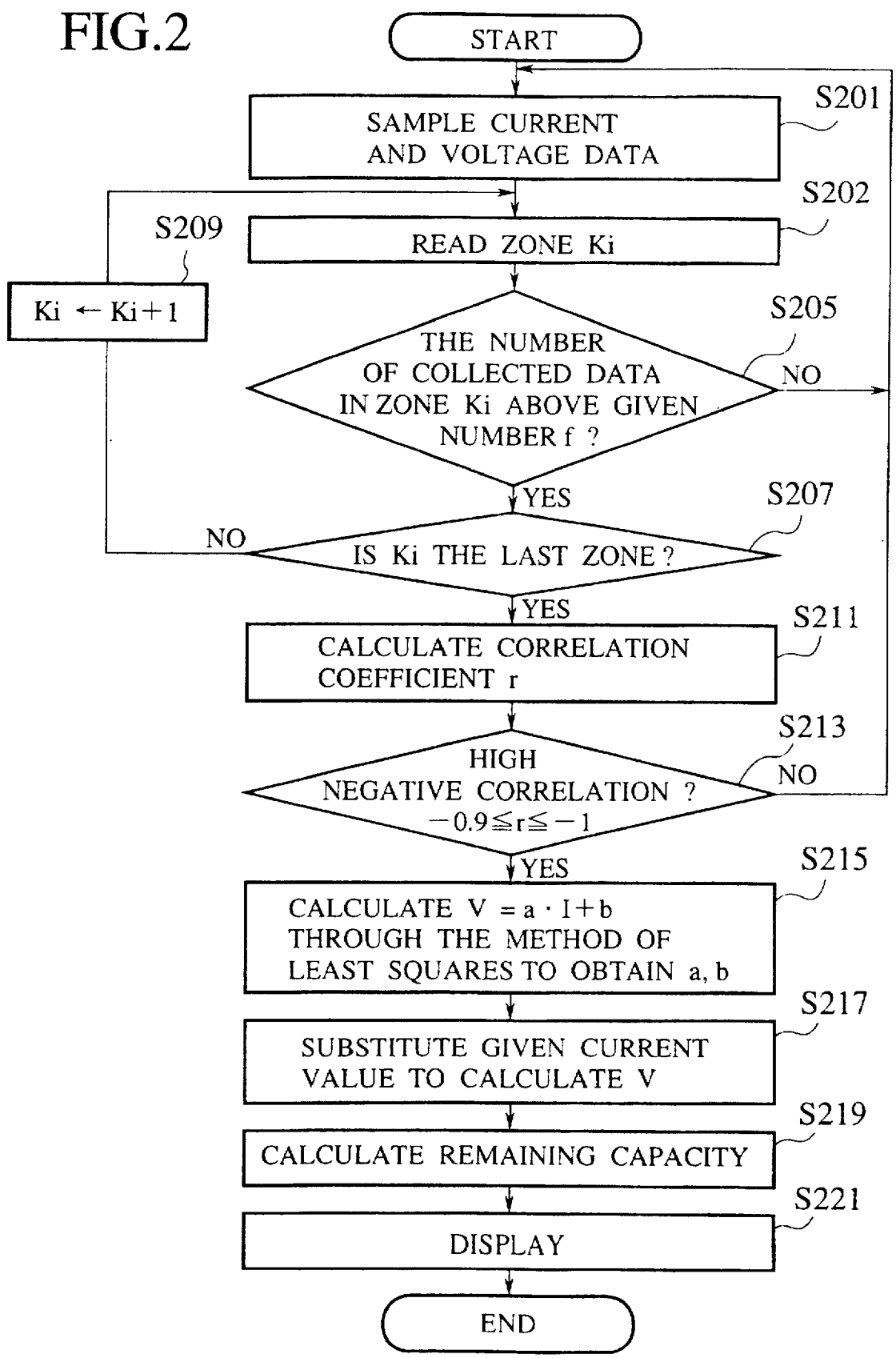
FIG. 2 is a flow chart showing an operation of the battery remaining capacity measuring system according to the embodiment.

FIG. 2 is a flow chart available for explaining an operation of the remaining capacity measuring system for an electric motor vehicle according to this embodiment.

In response to the turning-on of the ignition switch and the traveling of the electric motor vehicle, the data collecting and averaging section 17 makes the data reading section 10 sample the discharge current and the terminal voltage at an interval of 1 ms and makes the memory 18 retain these sampled data, and averages a plurality of sampled data at the elapse of 100 ms to obtain data on the I-V-axis coordinate in the memory 18. This processing is conducted for 10 seconds. In other words, 100 sets of average currents and average voltages are acquired through this processing(S201).

Figure 3:
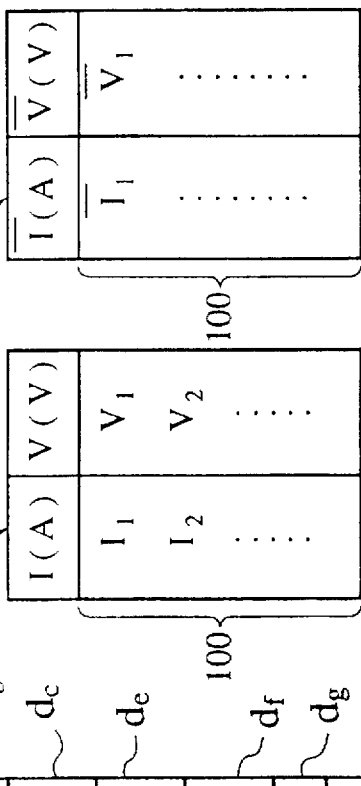
FIG. 3 is an illustration available for explaining a memory.
Figure 3:
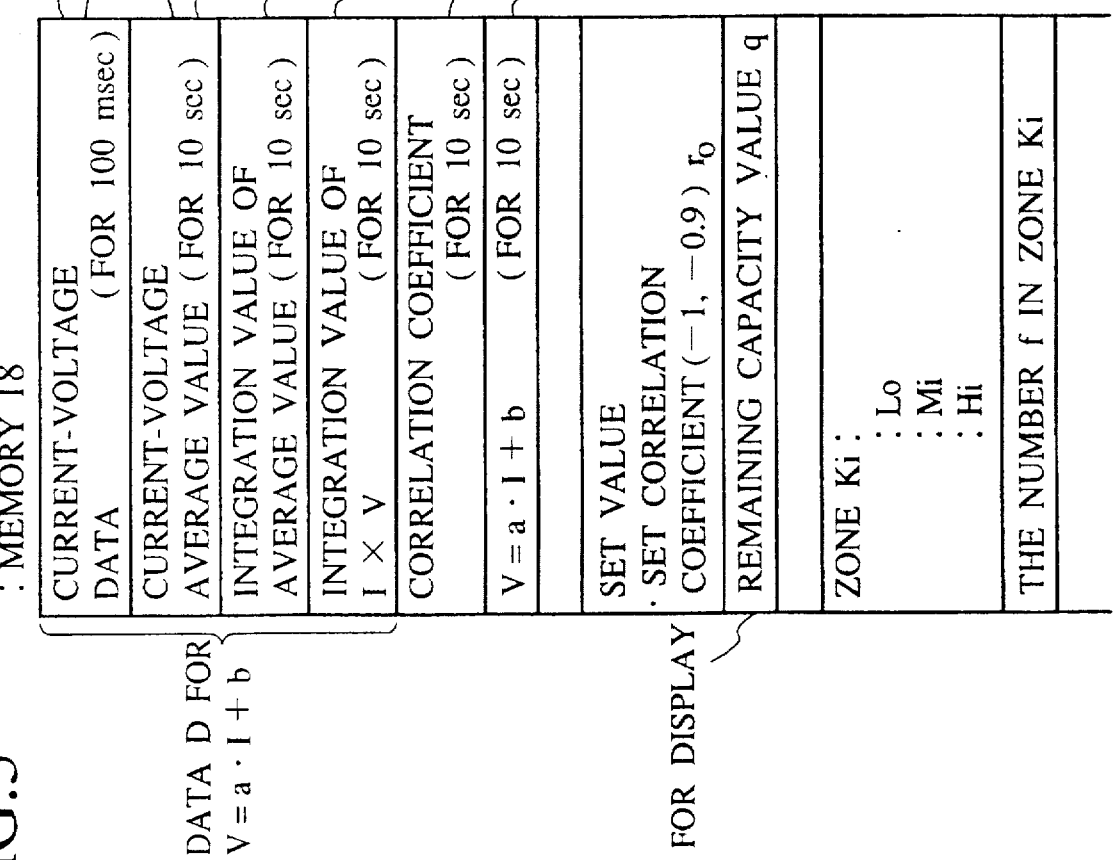

Furthermore, as shown in FIG. 3 the memory 18 has a current-voltage data region $d_a$ where the discharge current-terminal voltage data taken every 1 ms are stored by a quantity corresponding to 100 ms, a current-voltage average value region $d_b$ where the average value of the plurality of discharge current-terminal voltage data corresponding to 100 ms stored in the region $d_a$ is stored by a quantity corresponding to 10 seconds, and an integration value region $d_c$ where an integrated value of the average values stored in the region $d_b$ is stored. Further, the current-voltage average value region $d_b$ forms an I-V-axis coordinate in which the horizontal axis is taken as an I axis while the vertical axis is taken as a V axis.

In addition, in the memory 18 there are formed a region At $d_e$ for storing an integration value of product of the average current and the average voltage, a correlation coefficient region $d_f$ for storing a coefficient of correlation r obtained, a coefficient region $d_g$ for storing coefficients a, b for an approximate straight line, and so on.

Various data to be stored in these regions $d_a$ to $d_g$ serve as data D used for obtaining the approximate straight line (V=a·I+b).

Still further, as shown in FIG. 3 the memory 18 additionally has a region for storing a set correlation coefficient $r_o$, the remaining capacity value q attained in the remaining capacity decision section 15, the sectioned zones ki (Lo, Mi, Hi) of the I-V-axis coordinate for 10 seconds, and numbers f of data in the zones ki.

At a step S201, the data collecting and averaging section 17 collects 100 sets of average current data and average voltage data on the I-V-axis coordinate in the memory for 10 seconds, and then the sectioning section 24 reads the zone ki (ki←Lo) stored in the memory 18 and informs the in-zone quantity decision section 26 of the zone ki (ki←Lo)(S203).

When receiving the zone ki (ki←Lo) therefrom, the in-zone quantity decision section 26 reads out the number f from the memory 18 to decide whether or not the number of the data on the average currents and the average voltage in the zone ki (ki←Lo) exceeds the number f(S205). If at the step S205 the decision is made to that the number of the data in the zone ki does not exceed the number f, the operational flow returns to the step S201.

On the other hand, when at the step S205 the in-zone quantity decision section 26 decides that the number of the data in the zone ki exceeds the number f, the in-zone quantity decision section 26 checks whether or not the zone ki is the last one(S207).

If the answer of the step S207 is that the zone ki is not the last one, the sectioning section 24 forwards the a information on the next zone ki (for example, the updating is made in the order of Mi and Hi), and the operational flow returns to the step S203.

On the contrary, if the decision of the step S207 is that the zone ki is the last one, the correlation coefficient decision section 19 calculates the correlation coefficient r on the basis of the data over all the zones (S211) and decides whether or not the calculated correlation coefficient r shows a high negative correlation. When the answer of the step S213 is that it does not the high negative correlation, the operational flow returns to the step S201.

On the other hand, when the decision of the step S213 is the high negative correlation, the approximate straight line calculating section 21 calculates an approximate straight line (V=a·I+b) through the use of the method of least squares (S215).

Subsequently, the remaining capacity calculating means 22 substitutes a given current value I, stored in the memory 18 into the approximate straight line equation (V=a·I+b) (S217) to specify the present voltage of the battery 3 and further obtains a remaining capacity on the basis of the specified voltage(S219), which in turn, is displayed on the display section 16(S221).

Figure 4:
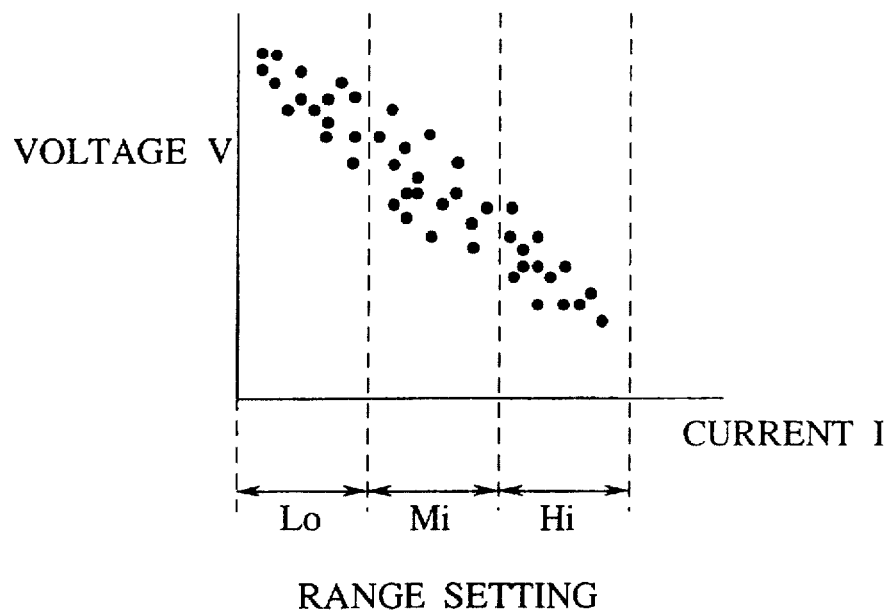
FIG. 4 is an illustration useful for description about sectioning a current-voltage-axis coordinate in this invention.

That is, the processes from the step S203 to the step S209 cause the sectioning of the I-V-axis coordinate along the I axis directions into three zones (Lo, Mi, Hi) as shown in FIG. 4 and perform the decision on whether or not the number of the data in each of those zones exceeds the given number.

Figure 5:
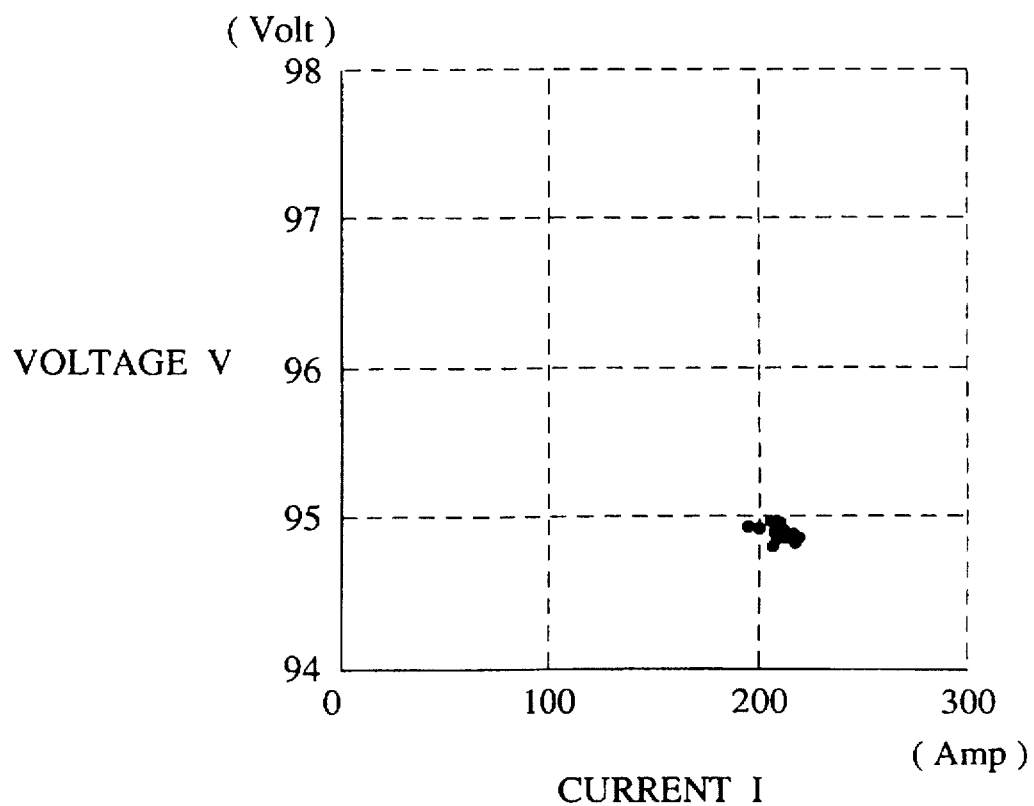
FIG. 5 shows the relationship between a discharge current and terminal voltage of a battery when an electric motor vehicle is in a full-accelerating condition.

Accordingly, while the electric motor vehicle is traveling, in cases where the data gather around one point on the I-V-axis coordinate as shown in FIG. 5, the calculation of the coefficient of correlation is not made on the basis of the data collected at that time. That is, in the case that there is a zone where the data concentrate around one point, the decision is never made to that a high correlation occurs.

Although in the above-described embodiment the approximate straight line equation is determined to be V=a·I+b, it is also appropriate that it is taken as I=a·V+b.

Furthermore, although in the above-described embodiment the current-voltage-axis coordinate is divided along the current axis directions, the division along the voltage axis directions is also feasible.

As described above, according to the present invention, JP the current data and the voltage data are sampled at a given time interval and a plurality of current data and a plurality of voltage data are averaged at a given time interval to obtain a set of average current data and average voltage data which in turn, is collected and plotted on the currentvoltage-axis coordinate. Further, the current-voltage-axis coordinate is sectioned into a plurality of zones, and when the in-zone quantity decision section decides that the number of the sets of average current data and average voltage data within each of all the zones exceeds a given value, the correlation coefficient decision section decides a coefficient of correlation between current and voltage. When the coefficient of correlation shows a high correlation, the approximate straight line calculating section calculates an approximate straight line, whereas the remaining capacity calculating section makes the display of the remaining capacity. Thus, the remaining capacity is specified from the obtained approximate straight line under the condition that the data collected on the current-voltage-axis coordinate show proper dispersion, and therefore the remaining capacity is found with a high precision.

Moreover, the data for the division of the currentvoltage-axis coordinate are put in the memory, and hence, the number of divisions or others can be changed in a manner that the data are merely rewritten on the memory. In addition, since the given number serving as the criterion for the decision in the in-zone quantity decision section is also stored in the memory, the criterion for the decision can flexibly be altered likewise.

It should be understood that the foregoing relates to only a preferred embodiment of the present invention, and that it is intended to cover all changes and modifications of the embodiment of the invention herein used for the purpose of the disclosure, which do not constitute departures from the spirit and scope of the invention.

What is claimed is:

1. A system which estimates remaining capacity of a battery for an electric motor vehicle, comprising:

an input portion including detectors which detect values of current flowing to a load coupled to the battery and a terminal voltage across the battery while said electric motor vehicle is in a running condition, said input portion further including a section collecting said detected current and voltage values to output a plurality of sets of collected current data and voltage data;

a remaining capacity operation portion connected to the input portion to receive and process said plurality of sets of collected current data and voltage data and to plot said processed plurality of sets as plotted data points on a coordinate system having a current axis and a voltage axis, said remaining capacity operation portion further including, a sectioning section which divides at least one of said current axis or said voltage axis into a plurality of zones by sectioning either along the current axis or along the voltage axis, an in-zone quantity determining section which provides a first output when a predetermined number of plotted data points is detected to be present in all of said plurality of zones and a second output when any one of the plurality of zones is detected to have less than the predetermined number of plotted data points, a correlation coefficient decision section which determines a coefficient of correlation between current and voltage on the basis of all said plurality of plotted data points in all of the plurality of zones when said in-zone quantity decision section provides said first output, said correlation coefficient decision section further providing a high correlation output when the determined correlation coefficient is higher than a reference value, and a remaining capacity calculating section responsive to the high correlation output from the correlation coefficient decision section to estimate the remaining capacity of the battery.

2. The system as defined in claim 1, wherein said second output of the in-zone quantity decision section is provided to the remaining capacity operation portion to delete all existing plotted data points on said coordinate system and to said input portion to cause the input portion to collect and process new detected current and voltage values.

3. The system as defined in claim 1, wherein said remaining capacity operation section further includes, a data collecting and averaging section which samples said plurality of sets of collected current data and voltage data over a first given time interval and averages the sampled plurality of sets of current data and voltage data over a second given time interval, respectively, to obtain said processed plurality of sets of current data and voltage data, an approximate straight line calculating means for obtaining section which provides an approximate straight line on the basis of all said plotted data points on said coordinate system when the coefficient of correlation has been determined to be higher than the reference value, and a remaining capacity calculating section which calculates a voltage value by substituting a given current value into a function representing the approximate straight line to obtain a remaining capacity corresponding to the calculated voltage value for display.

4. The system as defined in claim 3, further comprising a storage section which stores sectioning information and said predetermined number.

* * * * *

UNITED STATES PATENT AND TRADEMARK OFFICE
CERTIFICATE OF CORRECTION

PATENT NO. : 5,793,211
DATED : AUGUST 11, 1998
INVENTOR(S) : KENICHI SHIMOYAMA

Figure 6:
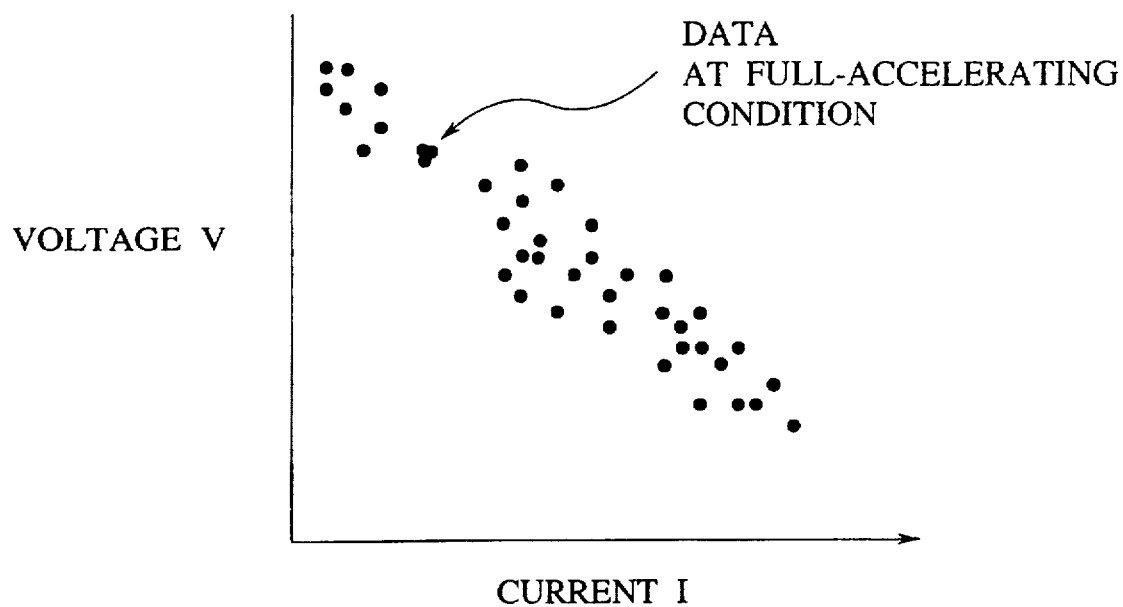
FIG. 6 as an illustration of the relationship between average currents and average voltages collected over a given period of time including the time that the motor vehicle takes the full-accelerating condition.
Figure 7:
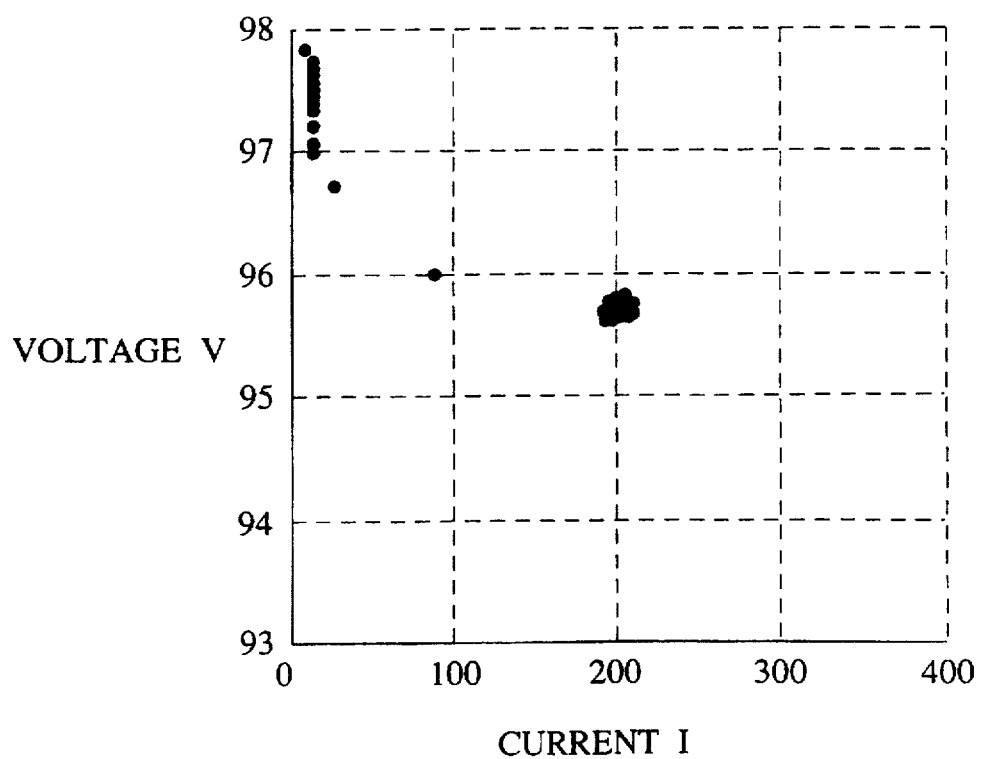
FIG. 7 is an illustration of the relationship between an average current and average voltage collected over a given period of time including the time that the motor vehicle runs on a steep uphill in the full-accelerating condition.

It is certified that error appears in the above-identified patent and that said Letters Patent is hereby corrected as shown below:

Column 1, line 63, please change "Fig. 6 the" to --Fig. 6, the--.
Column 2, line 1, please change "Fig. 7 the" to --Fig. 7, the--.
Column 2, line 23, please change "for a give period" to --for a given period--.
Column 4, line 9, please change "Fig. 6 as an" to --Fig. 6 is an--.
Column 6, line 33, please delete the word "a" after "forwards the".
Column 6, line 39, please insert a space between "r" and "on" or change it to "coefficient r on".
Column 6, line 51, please change "current value I stored" to --current value $I_o$ stored--.
Column 7, line 10, please delete "JP" after "invention,".
Column 7, line 15, please change "the currentvoltage" to --the current-voltage--.
Column 7, line 32, please change "the currentvoltage" to --the current-voltage--.

Signed and Sealed this

Twentieth Day of June, 2000

Attest:

Q. TODD DICKINSON

*Attesting Officer*     *Director of Patents and Trademarks*